United States Patent [19]
Nguyen

[11] Patent Number: 5,155,302
[45] Date of Patent: Oct. 13, 1992

[54] ELECTRONIC DEVICE INTERCONNECTION TECHNIQUES

[75] Inventor: Hung N. Nguyen, Bensalem, Pa.

[73] Assignee: AT&T Bell Laboratories, Murray Hill, N.J.

[21] Appl. No.: 720,067

[22] Filed: Jun. 24, 1991

[51] Int. Cl.$^5$ .................. H02G 15/08; H05K 1/00
[52] U.S. Cl. .................. 174/88 R; 174/261; 174/264; 361/414; 439/66
[58] Field of Search .................. 174/88 R, 261, 264; 361/393, 395, 414; 439/65, 66

[56] References Cited

U.S. PATENT DOCUMENTS

| | | | |
|---|---|---|---|
| 3,541,222 | 11/1970 | Parks et al. | 174/261 |
| 4,209,481 | 6/1980 | Kashiro et al. | 264/24 |
| 4,598,166 | 7/1986 | Neese | 361/414 |
| 4,737,112 | 4/1988 | Jin et al. | 439/66 |
| 4,744,007 | 5/1988 | Watari et al. | 361/414 |
| 4,778,635 | 10/1988 | Hechtman et al. | 264/24 |
| 4,843,191 | 6/1989 | Thomas | 174/88 |
| 4,868,712 | 9/1989 | Woodman | 365/414 |
| 4,998,885 | 3/1991 | Beamen | 439/66 |

OTHER PUBLICATIONS

"Applications and Reliability of the AT&T Elastomeric Conductive Polymer Interconnection (ECPI) System", J. A. Fulton et al., *IEPS*, Sep. 1990, pp. 930-943.

*Primary Examiner*—Morris H. Nimmo
*Attorney, Agent, or Firm*—R. B. Anderson

[57] ABSTRACT

External connections are made in an electronic device (11) having on an upper surface an array of contact pads (12) by providing successively over the electronic device a first anisotropic member (13), a first flat insulator member (14) having on an upper surface a first conductor pattern (29), a second flat anisotropic conductor member (15), and a second flat insulator member (17) having on an upper surface a second conductor pattern (30). The two flat insulator members contain an array of conductive vias (25, 26) extending between opposite surfaces. The first anistropic conductor member (13) and a first array of conductive vias (25) extending through the first insulative member (14) interconnects a first plurality of contact pads (12) on the electronic device (11) to the first conductor pattern (29) which includes a peripheral array of contact pads (32) to which external connections are made. Means for interconnecting a second plurality of the contact pads on the electronic device to the second conductor pattern (30) comprise the second flat anisotropic conductor member (15) and a second array of conductive vias (26) extending through the second insulator member (17), the first array of conductive vias (25) and the first anisotropic conductor member (13).

16 Claims, 2 Drawing Sheets

ELECTRONIC DEVICE INTERCONNECTION TECHNIQUES

TECHNICAL FIELD

This invention relates to techniques for connecting an electronic device to external circuitry and, more particularly, to methods for making contact to each contact pad of a high density array of contact pads of an integrated circuit chip.

BACKGROUND OF THE INVENTION

As the density of devices formed in integrated circuit chips has increased, the problem of making reliable connections to the chip has become more complicated. Most integrated circuit chips include contact pads arranged around the periphery of the device so that electrical connections can conveniently be made by any of a number of bonding techniques. Some integrated circuits, however, have so many separate contact pads that it is not possible to locate them all around the chip periphery.

For example, known photonics systems may require an array of thousands of photodetectors, each requiring a separate connection, defined on a single integrated circuit chip having an area of only about one square centimeter. There are other integrated circuit devices in which the number of contact pads has become so numerous that one cannot make the required connections of the chip to external circuitry without difficult and painstaking effort. The U.S. Pat. of Thomas, No. 4,843,191, provides one approach to the problem comprising the use of several rows of contact pads on the periphery of the chip to be contacted by tape automated (TAB) bonding to conductors carried on different insulator layers. It is difficult to use this technique with a matrix array, such as photoconductor arrays.

There has therefore developed a long-felt need for techniques to make contact to a high density of contact pads of an integrated circuit chip, particularly a dense matrix array of pads, in a manner that is reasonably inexpensive, reliable, and which is consistent with the mass production of such devices.

The invention makes use of a material known as an anisotropic conductor material, that is, a material that will conduct electricity in only one direction. Such material may comprise an insulative sheet containing spaced conductors extending across the thickness of the sheet as described, for example, in the U.S. Pat. of Kashiro et al., No. 4,209,481, granted Jun. 24, 1980. As another example, it may comprise a sheet of polymer material containing conductive ferromagnetic particles which have been aligned during cure of the polymer by a magnet to form conductor columns connecting opposite surfaces of the polymer sheet, as described generally in the U.S. Pat. of Hechtman et al., No. 4,778,635, granted Oct. 18, 1988 and in the paper, "Applications and Reliability of the AT&T Elastomeric Conductive Polymer Interconnection (ECPI) System," J. A. Fulton et al., IEPS, September 1990, pp. 930–943, both of which are hereby incorporated herein by reference.

SUMMARY OF THE INVENTION

In accordance with an illustrative embodiment of the invention, external connections are made to an electronic device having on an upper surface an array of contact pads by providing successively over the electronic device a first flat anisotropic conductor member, a first flat insulator member having on an upper surface a first conductor pattern, a second flat anisotropic conductor member, and a second flat insulator member having on an upper surface a second conductor pattern. The two flat insulator members contain an array of conductive vias extending between opposite surfaces. The first anisotropic conductor member and a first array of conductive vias extending through the first insulative member interconnect a first plurality of the contact pads on the electronic device to the first conductor pattern which includes a peripheral array of contact pads to which external connections can be made. Means for interconnecting a second plurality of the contact pads on the electronic device to the second conductor pattern comprise the second flat anisotropic conductor member and a second array of conductive vias extending through the second insulator member, the first array of conductive vias, and the first anisotropic conductive member. The conductor pattern on the second insulator member contains another peripheral array of contact pads to which external connection can be made.

The foregoing embodiment divides the contacts of the electronic device into two arrays of peripheral contact pads on two overlying flat insulator members. Thus, if the electronic device contained one hundred contact pads, one could form fifty peripheral contact pads on each of the two flat insulator members for making external connections to the device. It may be possible to arrange the fifty contact pads around a periphery of each of the two insulator members much more conveniently than to form one hundred contact pads around the periphery of the electronic device; and so the invention permits external connection by a plurality of peripheral contact pad arrays to the single dense contact pad array of an electronic device.

From the foregoing, it is apparent that a larger plurality of flat insulating members can be used to divide further the number of contact pads that can be used for making contact to the contact pads of the electronic device. That is, three, four, five or even more flat insulator members can be used with intervening anisotropic conductor members to provide a multiplicity of layers to which external contacts can be made. Each of the flat insulator members contains conductive vias for interconnecting electronic device contact pads to peripheral contact pads on the insulator member or for making a connection to another anisotropic conductor member, and thence to a conductive via of another flat insulator member. In a specific embodiment to be described in detail, three flat insulator members are used for providing interconnections to an array of thirty-six contacts of an electronic device. The first flat insulator layer includes four peripheral bonding pads for making external connections to four of the electronic device contact pads, the second insulator member provides twelve peripheral bonding pads, and the third insulator member provides twenty contact pads. This embodiment demonstrates that there is no need to divide the number of external bonding pads equally among the various flat insulator members that are used. A fewer number of peripheral bonding pads may be desirable on flat insulator members in which longer conductor paths to the peripheral conductor pads are required.

Various other objects, features, advantages, and various other embodiments of the invention will be better understood from a consideration of the following de-

DETAILED DESCRIPTION

Figure 1:
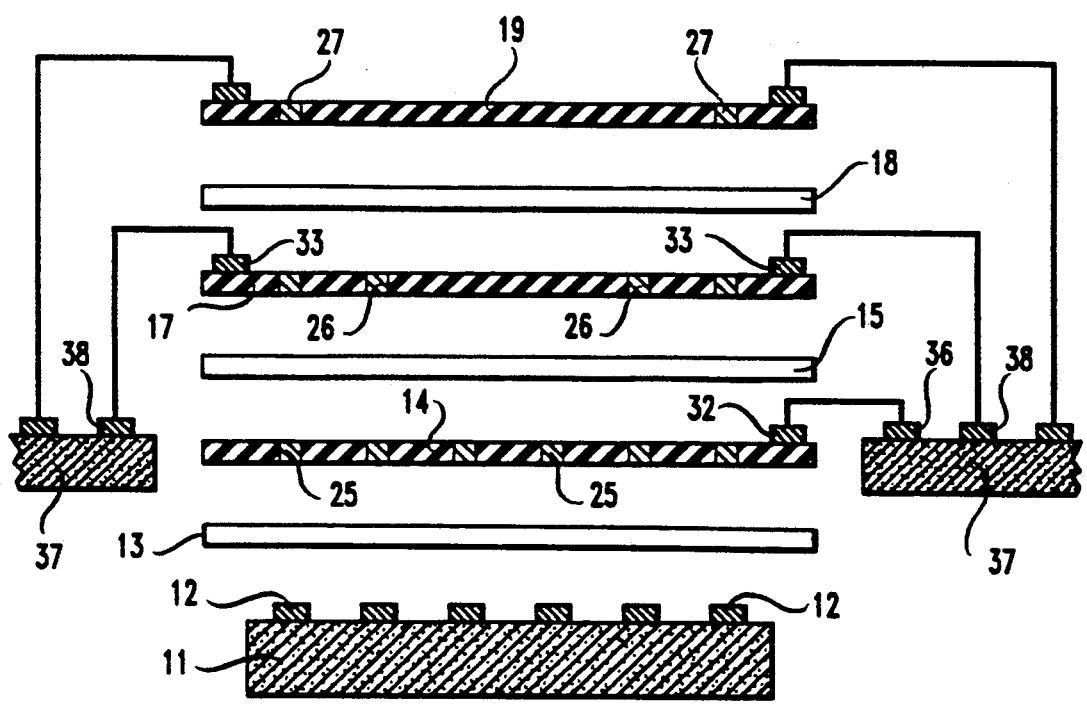
FIG. 1 is a schematic exploded view of part of an electronic device package in accordance with an illustrative embodiment of the invention.
Figure 2:
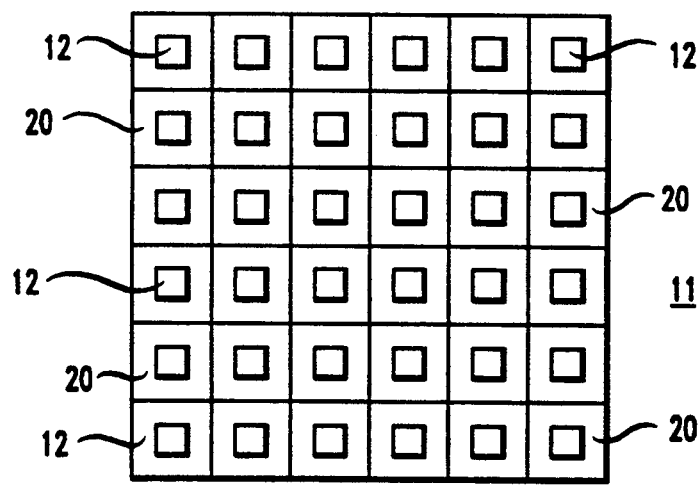
FIG. 2 is a top view of an integrated circuit chip of FIG. 1.

It is to be understood that the drawings are schematic and not to scale, and have been distorted to reveal more clearly certain important features of the invention. Referring now to FIG. 1, which is an exploded view of part of an electronic device package in accordance with an illustrative embodiment of the invention, there is shown an integrated circuit chip 11 containing on one surface an array of contact pads 12. Successively bonded to the upper surface of device 11 is a first flat anisotropic conductor member 13, a first flat insulator member 14, a second flat anisotropic conductor member 15, a second flat insulator member 17, a third flat anisotropic conductor member 18, and a third flat insulator member 19. Referring to FIG. 2, the integrated circuit device 11 illustratively comprises a matrix array of semiconductor photoconductor devices 20, each of which has a contact pad 12; as is known, photodetector arrays are useful in conjunction with various lightwave communications systems.

A common practice in integrated circuit fabrication and packaging is to make external connections to the device by way of conductor pads or bonding pads arranged on the periphery of the integrated circuit chip. The purpose of the assembly of FIG. 1 is to provide contacts on the peripheries of the three insulator members 14, 17, and 19, rather than all being included on the periphery of just one element.

Figure 3:
FIG. 3 is a sectional view of part of an anisotropic conductor member of FIG. 1.

The anisotropic conductor members 13, 15, and 18 are all made so as to conduct electrical current only in the vertical direction and not in the horizontal direction (hence, the term "anisotropic"). FIG. 3 shows a portion of anisotropic member 13 as an illustration of one of many forms such members can take. The major portion of the member 13 comprises an insulator material 22 with conductive elements 23 interconnecting upper and lower surfaces of the member. The conductors 23 may constitute solid conductor members as is described in the aforementioned Kashiro et al. patent, for example, or they may be magnetically aligned columns of conductive ferromagnetic particles, as described, for example, in the aforementioned Fulton et al. paper. In either case, the conductors 23 are not interconnected and do not touch each other so that there can be no conduction in the horizontal direction, but each conductor interconnects the opposite vertically displaced surfaces of the flat member 13. Further, the conductors 23 are sufficiently close together that they are separated by a maximum distance P in both the length and width directions. The separation distance may be regular or it may be arbitrary, but the distance P, known as the pitch, is a measure of the size of elements that can be interconnected by member 13. That is, the pitch P of the anisotropic conductor member 13 should be smaller than the length or width dimension of each conductor pad 12 of FIG. 2 to insure that at least one conductor 23 makes contact with each conductor pad 12.

Figure 4:
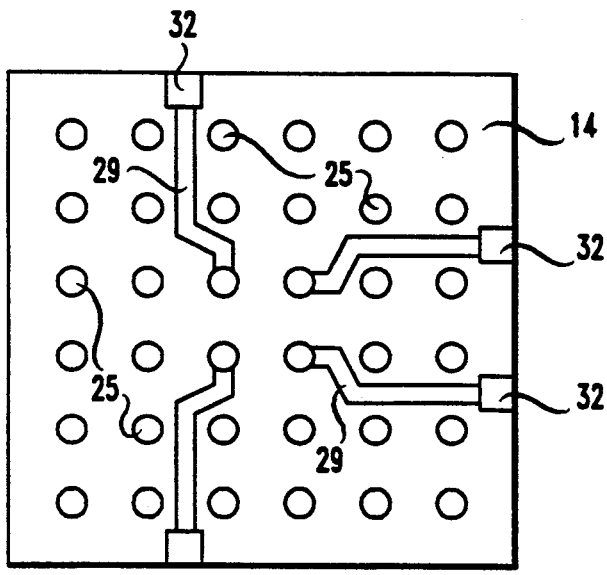
FIGS. 4, 5 and 6 are top views of flat insulator members of the embodiment of FIG. 1.
Figure 5:
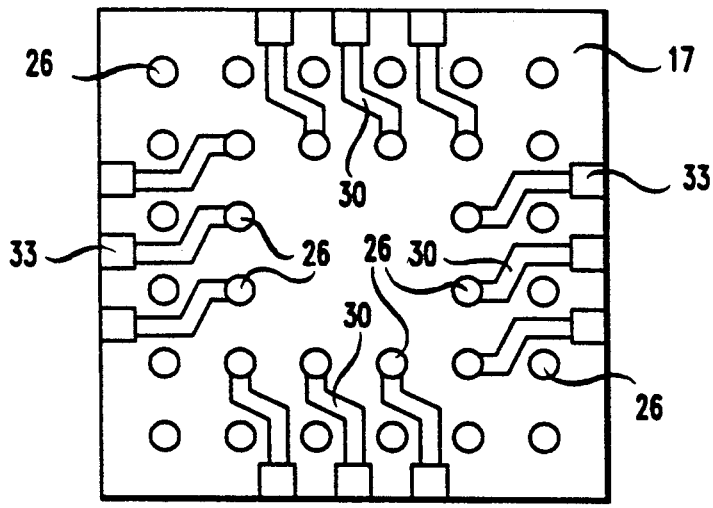
Figure 6:
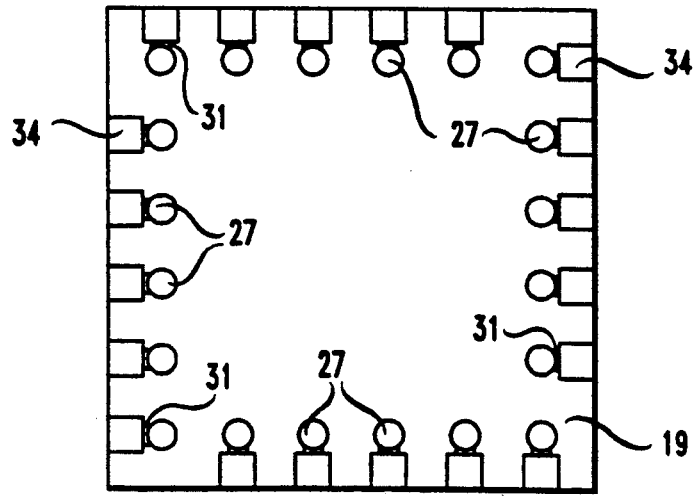

Referring again to FIG. 1, the first insulator member 14 includes therein a plurality of conductive vias 25, the second insulator member 17 contains an array of conductive vias 26, and the third insulator member 19 contains an array of conductive vias 27. Each of the conductive vias interconnects the lower surface of its respective insulator member with the upper surface. Referring to FIGS. 4-6, which are top views of the insulator members 14, 17 and 19 of FIG. 1, the first insulator member 14 includes on an upper surface a first conductor pattern 29, the second insulator member 17 includes on an upper surface a second conductor pattern 30, and the third insulator member 19 contains on an upper surface a third conductor pattern 31. The first conductor pattern 29 interconnects certain of the vias 25 with peripheral conductor pads 32, the second conductor pattern 30 connects certain other vias 26 with peripheral conductor pads 33, and the third conductor pattern 31 interconnects vias 27 with peripheral conductor pads 34.

Referring to FIG. 4, it can be seen that the first insulator member 14 has conductive vias 25 at locations that match the locations of the conductor pads 12 of FIG. 2. Thus, each of the conductor pads 12 of FIG. 2 is connected to the upper surface of insulator member 14 by way of the anisotropic conductor member 13 and the conductive vias 25. Four of the conductive vias 25 are connected to peripheral conductor pads 32 by way of the conductor pattern 29. As illustrated in FIG. 1, each of the peripheral conductor pads 32 is connected in a conventional manner to a conductor pad 36 of an external circuit that is illustratively supported by a substrate 37.

Referring to FIG. 5, the second insulator member 17 includes conductive vias 26 corresponding to the array of FIG. 2, except at locations corresponding to those to which external contact was made by the conductor pattern 29 of FIG. 4. That is, there are no conductive vias 26 at locations matching the four central contact pads of FIG. 2. Vias 26 are therefore connected to all but four of the pads 12 of FIG. 2 by way of second anisotropic conductor member 15, conductive vias 25, and first anisotropic conductor member 13. Twelve of the conductive vias 26 are connected to peripheral conductor pads 33, each of which are connected to the external circuitry by way of connections to external conductor pads 38, as shown in FIG. 1.

External contact to the outer contact pads 12 of the device 11 is provided by the circuit pattern 31 of insulator member 19 shown in FIG. 6. The insulator member contains conductive vias 27 only at locations corresponding to the outer conductor pads 12 of the array of FIG. 2 to which connection to the external circuitry has not been previously made. Thus, electrical connection is made between the peripheral contact pads 34 and corresponding conductor pads 12 of FIG. 2 by way of circuit pattern 31, conductive vias 27, anisotropic conductor 18 of FIG. 1, the conductive vias 26, the anisotropic conductor 15, the conductive vias 25, and the anisotropic conductor 13.

From the foregoing, it can be seen that the apparatus of FIG. 1 essentially divides the array of contact pads 12 of FIG. 2 into three groups. Peripheral contacts on the insulator members 14, 17, and 19, are made to each of the three groups, and such contacts can be made on the insulator members more conveniently because the number of peripheral contacts on each insulator member is smaller than would be the case if all of the peripheral contacts were made around the periphery of the integrated circuit chip 11.

In the example shown, the innermost four contacts 12 of FIG. 2 are connected to the external circuitry by way of the anisotropic conductor 23, the conductive vias 25, and the circuit pattern 29 of insulator member 14. The pitch P of each of the anisotropic conductor members 13, 15, and 18 should be smaller than the horizontal dimensions of any of the conductive vias 25, 26 and 27 to assure that dependable contact is made with all of the conductive vias. Notice that progressively more contact pads are included in FIGS. 5 and 6 than in FIG. 4. In general, it is desirable to minimize the number of connections to the innermost conductive vias as in FIG. 4, because of the relative complexity of such connections, while a relatively large number of connections can be made to the outermost vias as in FIG. 6. Nevertheless, the number of peripheral contact pads on each insulator member is a matter of design preference and clearly one could increase the number of peripheral contact pads on the upper surface of insulator member 14 of FIG. 4, if desired. For example, one could have twelve peripheral contacts for each of the insulator members 14, 17, and 19 to provide reliable external contact for the thirty-six contact pads 12 of FIG. 2.

The embodiment described in detail above has been presented primarily to illustrate the principles of the invention, rather than as being the most practical embodiment of the invention. It is expected, for example, that the invention will be used for making contact to an array of 64×64 photodetectors, or 4,096 photodetectors. It is calculated that for such use the pitch P of the anisotropic conductor of FIG. 3 should preferably be less than three mils. Anisotropic conductors with such a fine pitch can be made by the techniques described in the aforementioned Hechtman et al. patent and the Fulton et al. paper. It is expected that future refinements in the production of anisotropic conductors will make possible connections to matrix arrays of 128×128 photodetectors (16,384 separate devices).

It can be seen that the invention offers a large degree of flexibility, and the designer is free to use any number of conductor levels that is most appropriate for the production system involved. Connection to the peripheral contact pads can be made by using any of a number of known techniques such as wire bonding and tape automated (TAB) bonding. The different insulator members can have different dimensions to expedite bonding to the peripherally located contact pads of such layers.

The conductor patterns supported by the various insulator members can be used for interconnecting chips or chip elements as well as simply making external connection to a chip. For example, modern multichip modules (MCMs) typically comprise a planar silicon surface supporting a number of interconnected integrated circuit chips. The conductor patterns on the various insulator members of the invention could bridge two or more chips and provide interconnection between them; that is, specific contact pads of one chip could be connected by way of anisotropic conductors, conductive vias and conductor patterns to specific contact pads of another chip. In wafer scale integration, redundancy is built into a circuit covering an entire wafer surface to prevent loss of the entire wafer by the failure of a single component. The invention could be used to provide tailored or customized interconnections between elements of a wafer to reduce the amount of required redundancy; that is, after fabrication, the invention could be used to provide auxiliary interconnections on the wafer surface which could be used to connect supplemental or substitute elements to a system to replace local regions of failure.

The various layers of the apparatus of FIG. 1 are preferably permanently bonded together, although they could be held together by clamping apparatus. The various anisotropic conductor layers may be made of adhesive materials known as "Adcon" which may aid in the bonding of the package. An advantage of a clamped unbonded apparatus is that, if desired, layers can thereafter be selectively removed, for example, for repair or replacement. Various other modifications and embodiments can be made by those skilled in the art without departing from the spirit and scope of the invention.

I claim:

1. An electronic device package comprising:
   an electronic device having on an upper surface thereof a first array of contact pads;
   a first flat anisotropic conductor member overlying the first array of contact pads;
   a first flat insulator member overlying the first flat anisotropic conductive member and having on an upper surface thereof a first conductor pattern including a second array of contact pads;
   a second flat anisotropic conductive member overlying the first flat insulator member;
   a second flat insulator member overlying the second flat anisotropic conductor member and having on an upper surface a second conductor pattern including a third array of contact pads;
   first means comprising the first anisotropic conductive member and a first array of conductor vias extending through the first flat insulator member for interconnecting a first plurality of the first array of contact pads to the first conductor pattern;
   second means comprising the second flat anisotropic conductive member, a second array of conductor vias extending through the second insulator member, the first array of conductor vias, and the first flat anisotropic conductive member for interconnecting a second plurality of the first array of contact pads to the second conductor pattern;
   and interconnection means connected to the second and third arrays of contact pads for interconnecting at least part of the first array of contact pads of the electronic device with external circuitry.

2. The electronic device package of claim 1 further comprising:
   a third flat anisotropic conductor member overlying the second flat insulator member;
   a third flat insulator member overlying the second flat anisotropic conductor member and having on an upper surface thereof a third conductor pattern including a fourth array of contact pads;
   third means comprising a third array of conductive vias extending through the third flat insulator member, the third flat anisotropic conductive member, the second array of conductor vias, and the first flat anisotropic conductive member for interconnecting a third plurality of the first array of contact pads to the third conductor pattern;
   and said interconnection means for connecting at least part of the first array of contact pads of the electronic device with external circuitry includes supplementary interconnection means connected to the fourth array of contact pads.

3. The electronic device package of claim 1 wherein: the flat anisotropic conductor members each comprise an insulator sheet having conductors that extend through the sheet thickness, but which do not conduct electric current for significant distances in either the length or width directions of the sheet.

4. The electronic device package of claim 3 wherein: each conductor comprises a column of ferromagnetic conductive particles; and the columns are formed by magnetic alignment.

5. The electronic device package of claim 1 wherein: the electronic device comprises an integrated circuit chip.

6. The electronic device package of claim 1 wherein: the electronic device comprises a matrix array of semiconductor photodectors.

7. The electronic device package of claim 1 wherein: the number of conductive vias in the first array of conductor vias equals the number of contact pads in the first array of contact pads, and the location of the first array of conductor vias matches the location of the first array of contact pads.

8. The electronic device package of claim 7 wherein: the number of conductor vias in the second array of conductor vias is equal to the total number of contact pads in the first array of contact pads minus the number of contact pads in the first plurality of the first array of contact pads, and the locations of the conductor vias in the second array of conductor vias match the locations of the contact pads in the first array of contact pads that are not part of the first plurality of the first array of contact pads.

9. The electronic device package of claim 2 wherein: the number of conductor vias in the first array of conductor vias equals the number of first contact pads in the first array of contact pads, the number of conductor vias in the second array of conductor vias is equal to the total number of contact pads in the first array of contact pads minus the number of contact pads in the first plurality of the first array of contact pads, and the number of conductor vias in the third array of conductor vias equals the number of contact pads in the first array of contact pads minus the number of contact pads in the first and second pluralities of the first array of contact pads.

10. Electronic apparatus comprising:
an electronic device having on an upper surface thereof an array of conductor pads;
at least first, second and third flat insulator members successively arranged over the electronic device;
conductor vias in each of the flat insulator members and a conductor pattern on one surface of each of the flat insulator members;
anisotropic conductor members located between the flat insulator members and between the electronic device and the first flat insulator member;
means for making external connections to said conductor patterns on each of the flat insulator members;
and interconnecting means comprising said anisotropic conductor members and said conductor vias for interconnecting the conductor patterns of the flat insulator members to the array of conductor pads such that different conductor patterns of different flat insulator members are connected to different groups of conductor pads of the array of conductor pads.

11. The apparatus of claim 10 wherein:
a first group of conductor pads is connected to the conductor pattern of the first flat insulator member;
a second group of conductor pads is connected to the conductor pattern of the second flat insulator member;
and a third group of conductor pads is connected to the conductor pattern of the third flat insulator member.

12. The apparatus of claim 10 wherein:
the first, second and third flat insulator members are located in horizontal planes and are stacked successively in a vertical direction;
the anisotropic conductor members each comprise a flat insulator sheet contained in a horizontal plane with conductor elements extending vertically through the insulator sheet, the separation of adjacent conductor elements defining a pitch P;
and the horizontal dimensions of each of the conductor pads and of each of the conductor vias are larger than the pitch P.

13. The apparatus of claim 11 wherein:
the number of conductor vias in the first flat insulator member equals the number of contact pads on the electronic device, and the horizontal locations of each of the conductor vias in the first flat insulator member match the horizontal locations of the conductor pads.

14. The apparatus of claim 13 wherein:
the number of conductor vias in the second flat insulator member is equal to the total number of conductor pads minus the number of conductor pads in the first group of conductor pads, and the locations of each of the conductor vias in the second flat insulator member match the locations of those conductor pads that are not part of the first group of conductor pads.

15. The apparatus of claim 14 wherein:
the number of conductor vias in the third flat insulator member is equal to the number of conductor pads minus the number of conductor pads in the first and second groups of conductor pads, and the locations of the conductor vias in the third flat insulator member match the locations of those conductor pads that are not part of the first and second groups of conductor pads.

16. The apparatus of claim 15 wherein:
the second group of conductor pads surrounds the first group of conductor pads;
and the third group of conductor pads surrounds the first and second group of conductor pads.

* * * * *